United States Patent
Ruoff et al.

(10) Patent No.: US 11,914,303 B2
(45) Date of Patent: Feb. 27, 2024

(54) APPARATUS AND METHOD FOR CHARACTERIZING A MICROLITHOGRAPHIC MASK

(71) Applicant: Carl Zeiss SMT GmbH, Oberkochen (DE)

(72) Inventors: Johannes Ruoff, Aalen (DE); Heiko Feldmann, Aalen (DE); Ulrich Matejka, Jena (DE); Thomas Thaler, Jena (DE); Sascha Perlitz, Jena (DE); Shao-Chi Wei, Weimar (DE); Joerg Frederik Blumrich, Jena (DE); Markus Deguenther, Florstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 266 days.

(21) Appl. No.: 17/345,024

(22) Filed: Jun. 11, 2021

(65) Prior Publication Data

US 2021/0397099 A1 Dec. 23, 2021

(30) Foreign Application Priority Data

Jun. 18, 2020 (DE) ...................... 10 2020 207 566.2

(51) Int. Cl.
  *G03F 7/20* (2006.01)
  *G03F 7/00* (2006.01)
  *G01N 21/956* (2006.01)

(52) U.S. Cl.
  CPC ....... *G03F 7/70191* (2013.01); *G01N 21/956* (2013.01); *G01N 2021/95676* (2013.01)

(58) Field of Classification Search
  CPC ......... G01N 2201/061; G01N 2201/12; G01N 21/956; G01N 2021/95676; G03F 1/84;
  (Continued)

(56) References Cited

U.S. PATENT DOCUMENTS 5,235,408 A * 8/1993 Matsugu ............... G03F 9/7049
    250/548
5,959,721 A   9/1999 Nishi
    (Continued)

FOREIGN PATENT DOCUMENTS

CN   101458458    6/2009   .............. G03F 7/20
DE   102010047050 3/2012   .............. G03F 1/00
    (Continued)

OTHER PUBLICATIONS

The Notification of Reasons for Refusal issued by the Japanese Patent Office for Application No. JP 2021-101706, dated May 23, 2022 (with English Translation).
    (Continued)

*Primary Examiner* — Hoa Q Pham
(74) *Attorney, Agent, or Firm* — Fish & Richardson P.C.

(57) ABSTRACT

The invention relates to an apparatus and a method for characterizing a microlithographic mask. According to one aspect, an apparatus according to the invention comprises at least one light source which emits coherent light, an illumination optical unit which produces a diffraction-limited light spot on the mask from the coherent light of the at least one light source, a scanning device, by use of which it is possible to implement a scanning movement of the diffraction-limited light spot relative to the mask, a sensor unit, and an evaluation unit for evaluating the light that is incident on the sensor unit and has come from the mask, an output coupling element for coupling out a portion of the coherent light emitted by the at least one light source, and an intensity sensor for capturing the intensity of this output coupled portion.

17 Claims, 10 Drawing Sheets

(58) Field of Classification Search
CPC .............. G03F 7/0075; G03F 7/70158; G03F 7/70191; G03F 7/70358; G03F 7/70025; H04N 5/2256; H04N 5/372; H04N 7/18
USPC .............. 356/237.1–237.5, 445–448; 348/86
See application file for complete search history.

(56) References Cited

U.S. PATENT DOCUMENTS

| | | | |
|---|---|---|---|
| 5,986,743 | A | 11/1999 | Hanzawa |
| 6,239,861 | B1 | 5/2001 | Nara et al. |
| 6,738,135 | B1* | 5/2004 | Underwood ......... G01N 21/956 356/237.5 |
| 6,904,164 | B2 | 6/2005 | Norioka et al. |
| 7,027,143 | B1 | 4/2006 | Stokowski et al. |
| 7,068,363 | B2 | 6/2006 | Bevis et al. |
| 7,821,714 | B1* | 10/2010 | Lee ........................ G21K 1/062 356/639 |
| 7,995,832 | B2 | 8/2011 | Xiong et al. |
| 8,335,038 | B2 | 12/2012 | Lee et al. |
| 9,535,013 | B2 | 1/2017 | Matsumoto et al. |
| 9,835,940 | B2 | 12/2017 | Tseng et al. |
| 10,001,631 | B2 | 6/2018 | Bittner et al. |
| 10,042,270 | B2 | 8/2018 | Ekinci et al. |
| 10,114,293 | B2 | 10/2018 | Feldmann et al. |
| 10,151,922 | B2 | 12/2018 | Banyay et al. |
| 10,706,527 | B2 | 7/2020 | Kohyama et al. |
| 11,561,467 | B1* | 1/2023 | Lee .......................... G03F 1/84 |
| 11,624,712 | B2* | 4/2023 | Terasawa ............. G01N 21/956 356/237.2 |
| 11,747,289 | B2* | 9/2023 | Lee ..................... G03F 7/70666 250/358.1 |
| 2003/0085335 | A1 | 5/2003 | Almogy et al. |
| 2004/0053143 | A1 | 3/2004 | Sandstrom |
| 2004/0246476 | A1 | 12/2004 | Bevis et al. |
| 2006/0007541 | A1 | 1/2006 | Totzeck et al. |
| 2006/0012873 | A1 | 1/2006 | Totzeck et al. |
| 2006/0114453 | A1 | 6/2006 | Goldenshtein et al. |
| 2006/0181700 | A1 | 8/2006 | Andrews et al. |
| 2007/0188743 | A1* | 8/2007 | Tanaka ................. G01N 21/956 356/237.1 |
| 2008/0170774 | A1 | 7/2008 | Xiong et al. |
| 2009/0097008 | A1 | 4/2009 | Mos et al. |
| 2009/0147636 | A1 | 6/2009 | Obi et al. |
| 2010/0045955 | A1 | 2/2010 | Vladimirsky et al. |
| 2010/0060890 | A1 | 3/2010 | Tsuchiya et al. |
| 2011/0033887 | A1 | 2/2011 | Fang et al. |
| 2012/0075456 | A1 | 3/2012 | Seitz |
| 2013/0335552 | A1* | 12/2013 | Feldmann ................. G03F 1/84 348/86 |
| 2016/0266503 | A1* | 9/2016 | Van Voorst ......... G03F 7/70633 |
| 2017/0011495 | A1 | 1/2017 | Gaind et al. |
| 2019/0107781 | A1* | 4/2019 | Tinnemans ......... G03F 7/70158 |
| 2019/0302570 | A1 | 10/2019 | Kumar et al. |

FOREIGN PATENT DOCUMENTS

| | | | |
|---|---|---|---|
| DE | 102010063337 | 6/2012 | .............. G03F 1/00 |
| DE | 102018201495 | 1/2019 | .............. G03F 7/20 |
| JP | 2002-148420 | 5/2002 | |
| JP | 2010-515951 | 5/2010 | .............. G03F 1/08 |
| JP | 2010-282192 | 12/2010 | |
| JP | 2011-257222 | 12/2011 | |
| JP | 2013-019793 | 1/2013 | |
| JP | 2017-513041 | 5/2017 | |
| JP | 2018-163075 | 10/2018 | |
| JP | 2019-144069 | 8/2019 | |
| KR | 1020100130422 | 12/2010 | .............. G01B 9/02 |
| KR | 1020120109635 | 10/2012 | .............. G03F 1/00 |
| TW | 201706593 | 2/2017 | ............. G01N 21/95 |
| TW | 201712426 | 4/2017 | .............. G03F 1/62 |
| TW | 201937314 | 9/2019 | .............. G03F 9/00 |

OTHER PUBLICATIONS

The Office Action issued by the German Patent Office for German Application No. 10 2020 207 566.2, dated Dec. 7, 2020 (with English Translation).

The Non-Final Office Action for U.S. Appl. No. 13/994,797, dated Nov. 19, 2015.

The Final Office Action for U.S. Appl. No. 13/994,797, dated Jun. 8, 2016.

The Non-Final Office Action for U.S. Appl. No. 13/994,797, dated Jul. 28, 2017.

The Final Office Action for U.S. Appl. No. 13/994,797, dated Dec. 29, 2017.

The Non-Final Office Action for U.S. Appl. No. 13/994,797, dated Aug. 3, 2018.

The Final Office Action for U.S. Appl. No. 13/994,797, dated Apr. 2, 2019.

Chao, W. et al., "Demonstration of 12 nm Resolution Fresnel Zone Plate Lens based Soft X-ray Microscopy", *Optics Express*, vol. 17, No. 20, pp. 17669-17677 (Sep. 28, 2009).

Goldberg, K. et al., "New Ways of Looking at Masks with the SHARP EUV Microscope", *Proceedings of SPIE*, vol. 9422, pp. 94221A-1-94221A-11 (2015).

The Notice of Examination Opinion and Search Report from the Taiwan Intellectual Property Office for Application No. TW 110117752, dated Feb. 10, 2022 (with English Translation).

The Office Action and Search Report issued by the Taiwan Patent Office for Application No. TW 111136101 dated Jul. 18, 2023 (with English Translation).

The Notice of Reasons for Rejection issued by the Korean Patent Office for Application No. KR 10-2021-007469, dated Jun. 27, 2023 (with English Translation).

\* cited by examiner

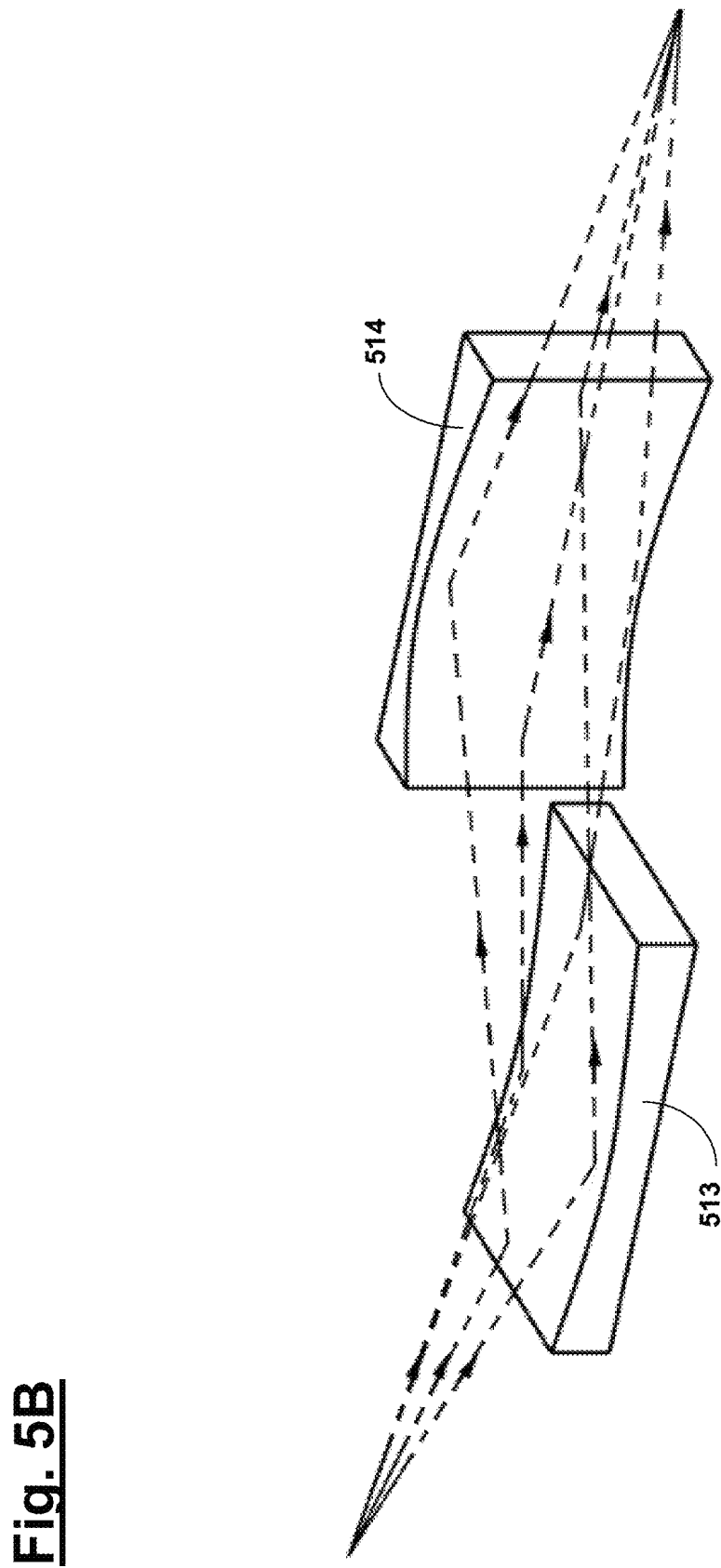

APPARATUS AND METHOD FOR CHARACTERIZING A MICROLITHOGRAPHIC MASK

CROSS-REFERENCE TO RELATED APPLICATIONS

This application claims priority of German Patent Application DE 10 2020 207 566.2, filed on Jun. 18, 2020. The content of the above application is hereby incorporated by reference in its entirety.

TECHNICAL FIELD

The invention relates to an apparatus and a method for characterizing a microlithographic mask.

BACKGROUND

Microlithography is used for production of microstructured components, such as integrated circuits or LCDs, for example. The microlithography process is carried out in what is known as a projection exposure apparatus, which includes an illumination device and a projection lens. The image of a mask (=reticle) illuminated by use of the illumination device is in this case projected by the projection lens onto a substrate (e.g. a silicon wafer) that is coated with a light-sensitive layer (photoresist) and arranged in the image plane of the projection lens in order to transfer the mask structure to the light-sensitive coating of the substrate.

In the lithography process, undesired defects on the mask have a particularly disadvantageous effect since they can be reproduced with every exposure step. A direct analysis of the imaging effect of possible defect positions is thus desirable in order to minimize the mask defects and in order to realize a successful mask repair. In principle, there is therefore a need to measure or to qualify the mask rapidly and simply, to be precise as far as possible under the same conditions such as are actually present in the projection exposure apparatus.

In this context, there are different approaches for emulating the projection exposure apparatus within the scope of the mask inspection (i.e., measuring the mask under conditions that are analogous to those in the projection exposure apparatus where possible).

Firstly, the practice of recording and evaluating an aerial image of a section of the mask in a mask inspection apparatus is known, wherein, for the purposes of recording the aerial image, the structures to be measured on the mask are illuminated by a magnifying illumination optical unit and the light coming from the mask is projected on a detector unit via an imaging optical unit and detected by said detector unit.

In this process, it is further known to undertake the illumination of the mask in the mask inspection apparatus in a manner identical to that in the projection exposure apparatus, wherein in particular the same wavelength, the same numerical aperture and also the identical (if appropriate polarized) illumination setting are set in the mask inspection apparatus.

Moreover, an approach is also known in which an apparatus for characterizing a mask is configured as a scanning microscope for the purposes of emulating the conditions present in the projection exposure apparatus. As per the schematic illustration of FIG. 9, an illumination optical unit 910 for the provision of illumination with fully coherent light of the light source 905 for the mask 920 to be characterized is firstly designed in such a way in this case that it emulates the projection optical unit of the microlithographic projection exposure apparatus. Secondly, an image recording or sensor arrangement 930 with a plurality of pixels 930-1, . . . , **930-*n*** of this scanning microscope is configured in such a way that it emulates the illumination optical unit of the microlithographic projection exposure apparatus.

With respect to the prior art, reference is made merely by way of example to DE 10 2010 063 337 B4 and U.S. Pat. No. 7,821,714 B1.

SUMMARY

It a general aspect, the present invention provides an apparatus and a method for characterizing a microlithographic mask, which enable a fast and reliable characterization taking account of the conditions given in the lithography process.

An apparatus according to the invention for characterizing a microlithographic mask comprises:
- at least one light source which emits coherent light,
- an illumination optical unit which produces a diffraction-limited light spot on the mask from the coherent light of the at least one light source,
- a scanning device, by use of which it is possible to implement a scanning movement of the diffraction-limited light spot relative to the mask,
- a sensor unit,
- an evaluation unit for evaluating the light that is incident on the sensor unit and has come from the mask,
- an output coupling element for coupling out a portion of the coherent light emitted by the at least one light source, and
- an intensity sensor for capturing the intensity of this output coupled portion.

The invention takes as a starting point the approach (known per se from DE 10 2010 063 337 B4) according to which, for emulating the conditions present in the projection exposure apparatus, an apparatus for characterizing a mask is configured as a scanning microscope, wherein, firstly, the illumination optical unit of this scanning microscope is designed in such a way that it emulates the projection optical unit of the microlithographic projection exposure apparatus and wherein, secondly, the image recording or sensor unit of this scanning microscope is configured in such a way that it emulates the illumination optical unit of the microlithographic projection exposure apparatus. Expressed differently, the imaging optical unit and illumination optical unit in a certain sense exchange their roles in view of the emulation of the microlithographic projection exposure apparatus in the apparatus according to the invention for characterizing a mask. In respect of the basic functionality of such an apparatus or mask inspection apparatus, reference is made to the aforementioned patent document DE 10 2010 063 337 B4, and published U.S. patent application US 2013/0335552, the entire contents of the above applications are herein incorporated by reference.

Now, according to one aspect, the invention contains the concept of output coupling a portion of the coherent light emitted by the at least one light source and of capturing the intensity or energy of this output coupled portion, taking the aforementioned approach as a starting point. According to the invention, this allows the ascertainment of energy fluctuations on the part of the (at least one) light source such that the images ultimately recorded by the sensor unit can be normalized in relation to the power of the at least one light source.

In this case, an advantageous consequence of the configuration according to the invention is that, inter alia, a distinction can be made in respect of brightness variations that occur in the images recorded by the sensor unit as to whether such brightness variations are caused by the currently characterized mask (e.g., as a result of defects possibly present on this mask) or whether such brightness variations are caused by energy fluctuations of the light source(s) utilized. In this way, it may be possible to avoid drawing incorrect conclusions about defects perceived to be present on the mask.

In this case, the invention can also make use of the circumstances that only relative variations or fluctuations over time are of interest in respect of the intensity or energy emitted by the at least one light source; that is to say, in particular, there is no need for a spatially resolved quantitative intensity measurement.

Moreover, the invention can make use of the circumstances that only a comparatively small portion of the light emitted by the at least one light source needs to be output coupled for said ascertainment of relative variations of the energy or intensity over time, and so the predominant portion of light by far is still available for the actual mask characterization.

By way of the aforementioned consideration of energy or intensity variations of the at least one light source, the invention particularly takes account of the circumstances that already minor variations (e.g., of the order of significantly less than one percent) are important for the reliable identification of relevant defects in the mask on account of the high demands in terms of accuracy in the microlithography application.

According to one embodiment, the output coupling element is a reflective element.

The output coupling according to the invention of a portion of the light produced by the at least one light source to the intensity sensor can be implemented in different ways here—as still described in more detail below. Thus, in embodiments, a mirror as an output coupling element can be arranged directly in the (typically collimated) beam path between light source(s) and illumination optical unit. The mean diameter of such a mirror can be less than 0.5 mm in particular, more particularly less than 0.1 mm. Moreover, the mean diameter of this mirror can be at least five times smaller, more particularly at least ten times smaller than the mean diameter of the coherent beam emitted by the at least one light source.

According to one embodiment, the output coupling element is consequently arranged between the at least one light source and the illumination optical unit.

According to a further embodiment, the output coupling element is arranged in the illumination optical unit.

In this case, a back-reflection of the illumination optical unit can be used for the output coupling according to the invention. According to the invention, it is also possible in this case to exploit the circumstances that said illumination optical unit merely represents a beam shaping optical unit in the system according to the invention and can, for example, consist of a single optical component such as, e.g., a zone plate. In this case, to realize the output coupling according to the invention, it is possible, for example, to increase the reflectivity of a region of this component or zone plate and this can be implemented, for example, by a coating with a suitable material, in particular a molybdenum (Mo)-silicon (Si) reflection layer stack.

Moreover, what can be exploited according to the invention in this configuration is that the relevant component or zone plate is typically arranged in tilted fashion (in relation to the beam emitted by the at least one light source) in the beam path in any case, and so said back-reflection does not run back to the light source and is consequently able to reach the intensity sensor according to the invention.

According to one embodiment, the output coupling element is designed to output couple a portion of the coherent light emitted by the at least one light source, the intensity proportion of which is less than 10%, in particular less than 5%, further particularly less than 1%.

According to one embodiment, the apparatus further comprises an array of a plurality of optical elements that are adjustable independently of one another, e.g., in the form of an MMA ("micro mirror array"), said array being arranged in the optical path between the mask and the sensor unit.

This configuration is advantageous, inter alia, in the apparatus according to the invention inasmuch as the emulation of the illumination optical unit of the projection exposure apparatus, which is implemented on the side of the image recording arrangement of the apparatus in accordance with the concept according to the invention, can also be realized without the use of a spatially resolved sensor unit since the required elimination of individual pixels in the recorded image need not be implemented in the sensor unit itself or during the evaluation of the relevant image but can already be implemented by a suitable setting of the optical elements of the array.

Further, the array of optical elements that are adjustable independently of one another can also be used (in addition or as an alternative to the above-described selection of the pixels contributing to the image in the sensor unit) to intermittently—specifically during the advance of the mask—set all of the adjustable optical elements of the array in such a way that no light is incident on the sensor unit any more, for example during a "step and repeat mode" (in which the mask remains at one and the same position during the illumination and is only advanced by one step following the illumination).

Expressed differently, the array of optical elements that are adjustable independently of one another can therefore also adopt the function of a "shutter", as a result of which it is possible to avoid alternating activation and deactivation of the light source(s).

Moreover, the array of optical elements that are adjustable independently of one another also provides the option of realizing greyscale values since the respective exposure duration or the exposure dose is individually adjustable via the individual optical elements or mirror elements by virtue of the relevant optical element being "deactivated" or tilted in such a way that light incident on this element no longer reaches the sensor unit after the individually specifiable time duration (which is also shorter than the overall exposure duration).

The above-described configuration is also advantageous independently of the above-presented aspect of output coupling a portion of the coherent light emitted by the at least one light source and capturing the intensity or energy of this output coupled portion. According to a further aspect, the invention consequently also relates to an apparatus for characterizing a mask for microlithography, comprising at least one light source which emits coherent light, an illumination optical unit which produces a diffraction-limited light spot on the mask from the coherent light of the at least one light source, a scanning device, by use of which it is possible to implement a scanning movement of the diffraction-limited light spot relative to the mask, a sensor unit, and an evaluation unit for evaluating the light that is incident on the sensor unit and has come from the mask, wherein an array made of a plurality of optical elements that are adjustable independently of one another is arranged in the optical path between mask and sensor unit.

According to one embodiment, the at least one light source is an HHG laser (HHG="high-order harmonic generation"). Such a light source produces a quasi-continuous spectrum with a sufficient number of photons, the desired wavelength or the desired wavelength range being able to be filtered out of said spectrum using a suitable spectral element. In this case, the electromagnetic radiation is already collimated and can thus be focused on the mask in comparatively simple fashion.

According to one embodiment, the apparatus comprises a plurality of coherent light sources. This configuration is advantageous (particularly but not exclusively in combination with the above-described beam output coupling according to the invention) in order to take account of the typically quite significant restriction of the output power of suitable coherent light sources (e.g., HHG sources), which can lie in the milliwatt (mW) range, for example. Here, in the case of a pulsed operation (for example given in the case of an HHG laser source), the dead time remaining between the pulses of a light source can be respectively used for pulsed light from one or more further light source(s), wherein, in that case, the beams produced by the light sources situated at different positions can be combined by way of a suitable switching optical unit, e.g., a tiltable mirror or a mirror arrangement with one or more adjustable mirror elements. As a result, this can realize multiplexing of a plurality of light sources.

The above-described configuration is also advantageous independently of the above-presented aspect of output coupling a portion of the coherent light emitted by the at least one light source and capturing the intensity or energy of this output coupled portion. According to a further aspect, the invention consequently also relates to an apparatus for characterizing a mask for microlithography, comprising a plurality of light sources which emit coherent light, a switching optical unit for combining the light produced by these light sources, an illumination optical unit which produces a diffraction-limited light spot on the mask from the coherent light, a scanning device, by use of which it is possible to implement a scanning movement of the diffraction-limited light spot relative to the mask, a sensor unit, and an evaluation unit for evaluating the light that is incident on the sensor unit and has come from the mask.

According to one embodiment, the illumination optical unit comprises at least one mirror, the latter being arranged in such a way that the angles of incidence arising at an optical effective surface (e.g., an optical reflective surface) of the mirror during the operation of the apparatus are at least 70° in relation to the respective surface normal.

Expressed differently, according to this aspect, the illumination optical unit comprises at least one mirror operated under grazing incidence (GI="grazing incidence"). This configuration is advantageous inasmuch as the high reflectivity, which is wanted as a matter of principle, can be attained within the illumination optical unit in largely wavelength-independent fashion in the case of the operation under grazing incidence, with the consequence that the apparatus according to the invention can also be used—e.g., in a further mode of operation—for observing or inspecting the mask to be characterized, at other working operating wavelengths (which may also be in the EUV range in certain circumstances) utilized by the microlithographic projection exposure apparatus.

In this case, a larger frequency spectrum can be used in said further mode for the purposes of obtaining a greater throughput (by virtue of, for example, a filter otherwise used in combination with an HHG light source being removed or replaced) so that, e.g., relatively large defects on the mask are identified in this way, a more detailed examination at the actual (actinic) wavelength of the microlithographic projection exposure apparatus no longer being necessary at all for said defects (e.g., because these relatively large defects should be considered bothersome in any case and should therefore be eliminated).

Expressed differently, this configuration increases the functionality of the apparatus according to the invention by virtue of facilitating a switchover between modes of operation that differ in respect of the respective operating wavelength (e.g., (i) preliminary inspection for identifying relatively large defects using a broadband light source and (ii) actual examination of the remaining defects at an actinic wavelength).

The above-described configuration is also advantageous independently of the above-presented aspect of output coupling a portion of the coherent light emitted by the at least one light source and capturing the intensity or energy of this output coupled portion. According to a further aspect, the invention consequently also relates to an apparatus for characterizing a mask for microlithography, comprising at least one light source which emits coherent light, an illumination optical unit which produces a diffraction-limited light spot on the mask from the coherent light of the at least one light source, a scanning device, by use of which it is possible to implement a scanning movement of the diffraction-limited light spot relative to the mask, a sensor unit, and an evaluation unit for evaluating the light that is incident on the sensor unit and has come from the mask, wherein the illumination optical unit comprises at least one mirror, the latter being arranged in such a way that the angles of incidence arising at an optical effective surface of the mirror during the operation of the apparatus are at least 70° in relation to the respective surface normal.

According to one embodiment, the illumination optical unit comprises at least one mirror, the latter being arranged in such a way that the angles of incidence arising at an optical effective surface of the mirror during the operation of the apparatus are at most 20° in relation to the respective surface normal.

Expressed differently, according to this configuration, the illumination optical unit comprises at least one mirror operated substantially under normal incidence (NI="normal incidence"). Such a configuration of the illumination optical unit (e.g., a Schwarzschild optical unit) in the apparatus according to the invention is advantageous in comparison with, for instance, the aforementioned zone plate inasmuch as it is possible in that case to dispense with a placement of the illumination optical unit at a small distance from the mask— required when using a zone plate for reasons of minimizing chromatic aberrations—and hence also possible to facilitate the characterization or inspection of masks equipped with a protective membrane.

The above-described configuration is also advantageous independently of the above-presented aspect of output coupling a portion of the coherent light emitted by the at least one light source and capturing the intensity or energy of this output coupled portion. According to a further aspect, the invention consequently also relates to an apparatus for characterizing a mask for microlithography, comprising at least one light source which emits coherent light,
an illumination optical unit which produces a diffraction-limited light spot on the mask from the coherent light of the at least one light source,
a scanning device, by use of which it is possible to implement a scanning movement of the diffraction-limited light spot relative to the mask,
a sensor unit, and
an evaluation unit for evaluating the light that is incident on the sensor unit and has come from the mask,
wherein the illumination optical unit comprises at least one mirror, the latter being arranged in such a way that the angles of incidence arising at an optical effective surface of the mirror during the operation of the apparatus are at most 20° in relation to the respective surface normal.

According to one embodiment, the apparatus further comprises at least one phase shifter element in the optical path between light source and mask. Such a phase shifter element facilitates the modification of the beam path by impressing a phase shift and hence, in the case of a suitable configuration, the emulation of the projection exposure apparatus in respect of possibly present phase aberrations as well.

The above-described configuration is also advantageous independently of the above-presented aspect of output coupling a portion of the coherent light emitted by the at least one light source and capturing the intensity or energy of this output coupled portion. According to a further aspect, the invention consequently also relates to an apparatus for characterizing a mask for microlithography, comprising at least one light source which emits coherent light,
an illumination optical unit which produces a diffraction-limited light spot on the mask from the coherent light of the at least one light source,
a scanning device, by use of which it is possible to implement a scanning movement of the diffraction-limited light spot relative to the mask,
a sensor unit, and
an evaluation unit for evaluating the light that is incident on the sensor unit and has come from the mask,
wherein at least one phase shifter element is arranged in the optical path between light source and mask.

The invention furthermore also relates to a method for characterizing a microlithographic mask, wherein a diffraction-limited light spot is produced on the mask from coherent light produced by at least one light source by way of an illumination optical unit,
wherein a scanning movement of the diffraction-limited light spot is implemented relative to the mask, and
wherein light that is incident on a sensor unit and has come from the mask is evaluated;
wherein a portion of the coherent light emitted by the at least one light source is output coupled and the intensity of this output coupled portion is captured.

With regard to advantages and preferred embodiments of the method, reference is made to the above explanations in association with the apparatus according to the invention.

Further configurations of the invention can be gathered from the description and the dependent claims.

The invention is explained in greater detail below on the basis of exemplary embodiments illustrated in the accompanying figures.

BRIEF DESCRIPTION OF DRAWINGS

FIGS. 5A-5B show schematic illustrations for explaining further configurations of an illumination optical unit present in an apparatus according to the invention;

DETAILED DESCRIPTION

What is common to the embodiments of an apparatus for characterizing a microlithographic mask, as described below, is that—proceeding from the principle described in DE 10 2010 063 337 B4—the apparatus or mask inspection apparatus is configured as a scanning microscope, wherein fully coherent light of a light source is steered via an illumination optical unit to the mask to be characterized, in such a way that only a single diffraction-limited light spot is illuminated on the mask.

In this case, the illumination optical unit of the microlithographic projection exposure apparatus is emulated on the imaging side in the apparatus according to the invention by an appropriate selection of the pixels contributing to the image in the sensor unit that follows the mask in the beam path. Here, said pixel selection can be made in different ways, either in accordance with the embodiments described in the aforementioned patent document or else in accordance with the embodiments yet to be described below with reference to FIGS. 7 and 8.

Figure 1:
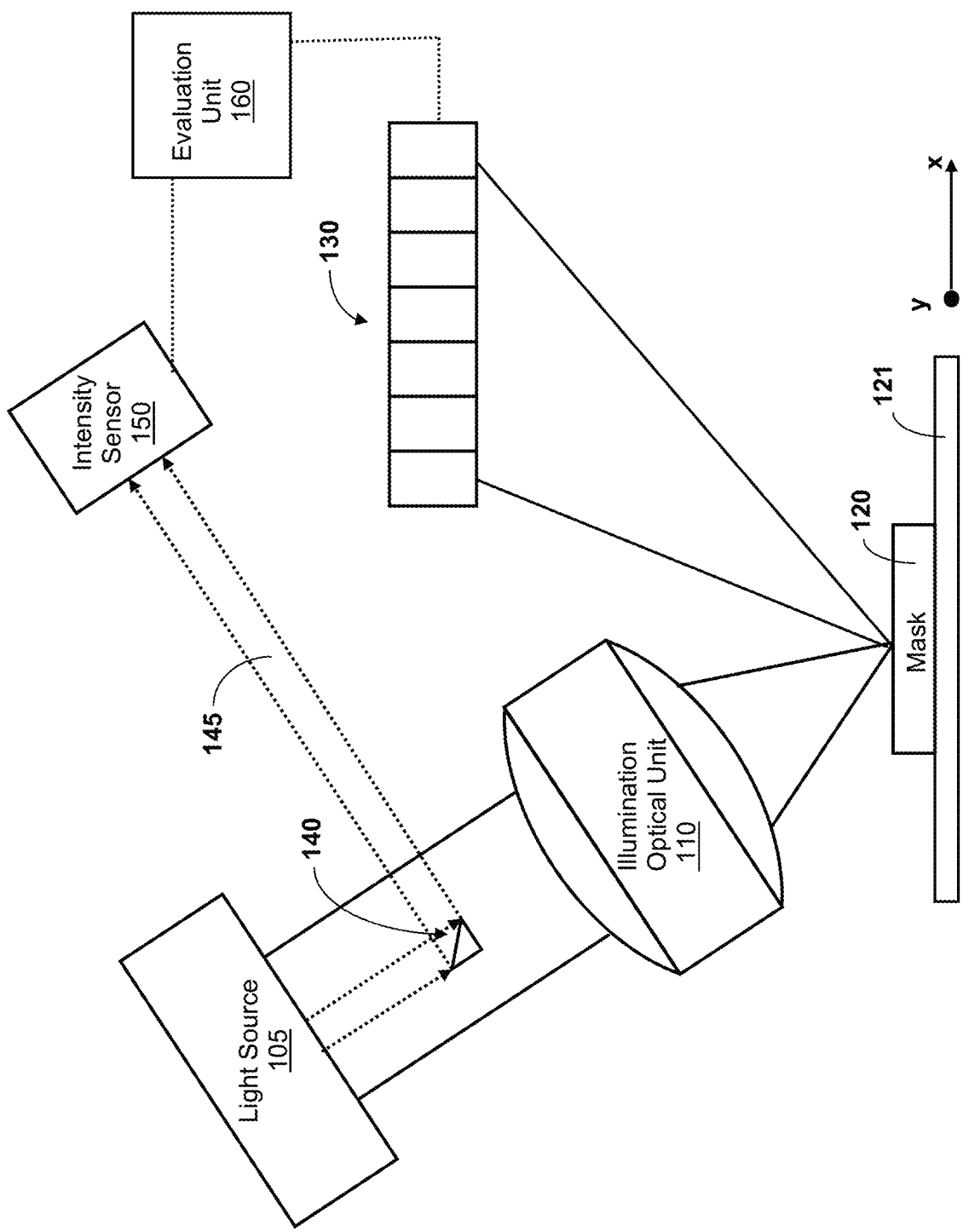
FIG. 1 shows a schematic illustration for explaining the possible set up of an apparatus according to the invention for characterizing a mask in a first embodiment.

FIG. 1 shows a first embodiment of an apparatus according to the invention in an only schematic illustration. According to FIG. 1, the apparatus comprises a light source 105 for producing fully coherent light, wherein the light source 105 can be configured as an HHG laser, in particular. However, the invention is not restricted thereto, and so other coherent sources (e.g., a synchrotron or a free electron laser) can also be used in further embodiments.

According to FIG. 1, coherent light emanating from the light source 105 strikes an illumination optical unit 110 in a collimated beam path and the illumination optical unit focuses the illumination light on a diffraction limited light spot on a mask 120 to be characterized. In this case, the illumination optical unit 110 merely represents a beam shaping optical unit which, in particular, can consist of a single optical component (e.g., a zone plate 310 as per FIG. 3A).

To check the imaging effect of the mask 120, a scanning movement of the diffraction limited light spot is implemented relative to the mask 120, wherein this scanning process can be realized by moving only the illumination optical unit 110 or the component producing the diffraction limited light spot, by moving the illumination optical unit 110 and the sensor unit 130 while the mask is kept stationary, or else by moving only the mask 120 while the illumination optical unit 110 and the sensor unit 130 are kept stationary. In FIG. 1, a scanning device 121 for moving the mask 120 along the (positive and negative) x- and y-directions is schematically illustrated.

In order to select the pixels on the part of the sensor unit 130 for the purposes of emulating the illumination device of the microlithographic projection exposure apparatus, the sensor unit 130 can be configured as a spatially resolved sensor arrangement (e.g., CCD camera), in a manner analogous to the aforementioned DE 10 2010 063 337 B4. In this case, depending on the respective illumination setting to be emulated, a finite portion of the pixels can remain unconsidered when evaluating the light incident on the sensor unit 130. However, the invention is not limited thereto. Thus, a non-spatially resolved sensor (e.g., a simple photodiode) can be used to detect the light emanating from the mask to be characterized in further embodiments (e.g., as described on the basis of FIG. 7 and FIG. 8), wherein the emulation of the illumination setting is then made differently (e.g., using the arrangements, described in FIG. 7 and FIG. 8, respectively, of optical elements that are adjustable independently of one another).

Referring back to FIG. 1, the apparatus according to the invention further comprises an output coupling element 140 in the form of a mirror, for output coupling a portion 145 of the coherent light emitted by the light source 105, with this output coupled portion 145 being captured by an intensity sensor 150.

Depending on the operating wavelength of the light source (e.g., approximately 13.5 nm), the mirror forming the output coupling element 140 can have a suitable coating, in particular a molybdenum (Mo)-silicon (Si) reflection layer stack.

By using the intensity sensor 150 in combination with the output coupling element 140, the invention allows energy fluctuations on the part of the light source 105 to be ascertained such that the images recorded by the sensor unit 130 can be normalized in relation to the power of the light source 105. In particular, this allows a distinction to be made in respect of whether brightness variations in the images recorded by the sensor unit 130 are caused by defects present on the mask 120 or by energy fluctuations of the light source 105, and so it may be possible to avoid drawing incorrect conclusions about defects perceived to be present on the mask.

In some implementations, an evaluation unit 160 receives outputs from the intensity sensor 150 and the sensor unit 130, and normalizes the images recorded by the sensor unit 130 using the output from the intensity sensor 150. The output from the intensity sensor 150 can be used to determine the energy fluctuations on the part of the light source 105. For example, suppose that during a calibration phase of the apparatus, the average intensity measured by the intensity sensor 150 is determined to be $I_0$ and used as a reference. Later, the apparatus is used to scan the mask 120 to check the imaging effect of the mask 120. Suppose the intensity of light detected by the sensor unit 130 is I_image_measured. If the output of the intensity sensor 150 changes to, e.g., $k*I_0$, k being a real number not equal to 1, that indicates the intensity of the light source 105 has changed. To compensate the fluctuation of the light source 105, the intensity of light detected by the sensor unit 130 can be divided by k, i.e., I_image_compensated=I_image_measured/k. The evaluation unit then evaluates the normalized images to characterize the mask 120.

Figure 2:
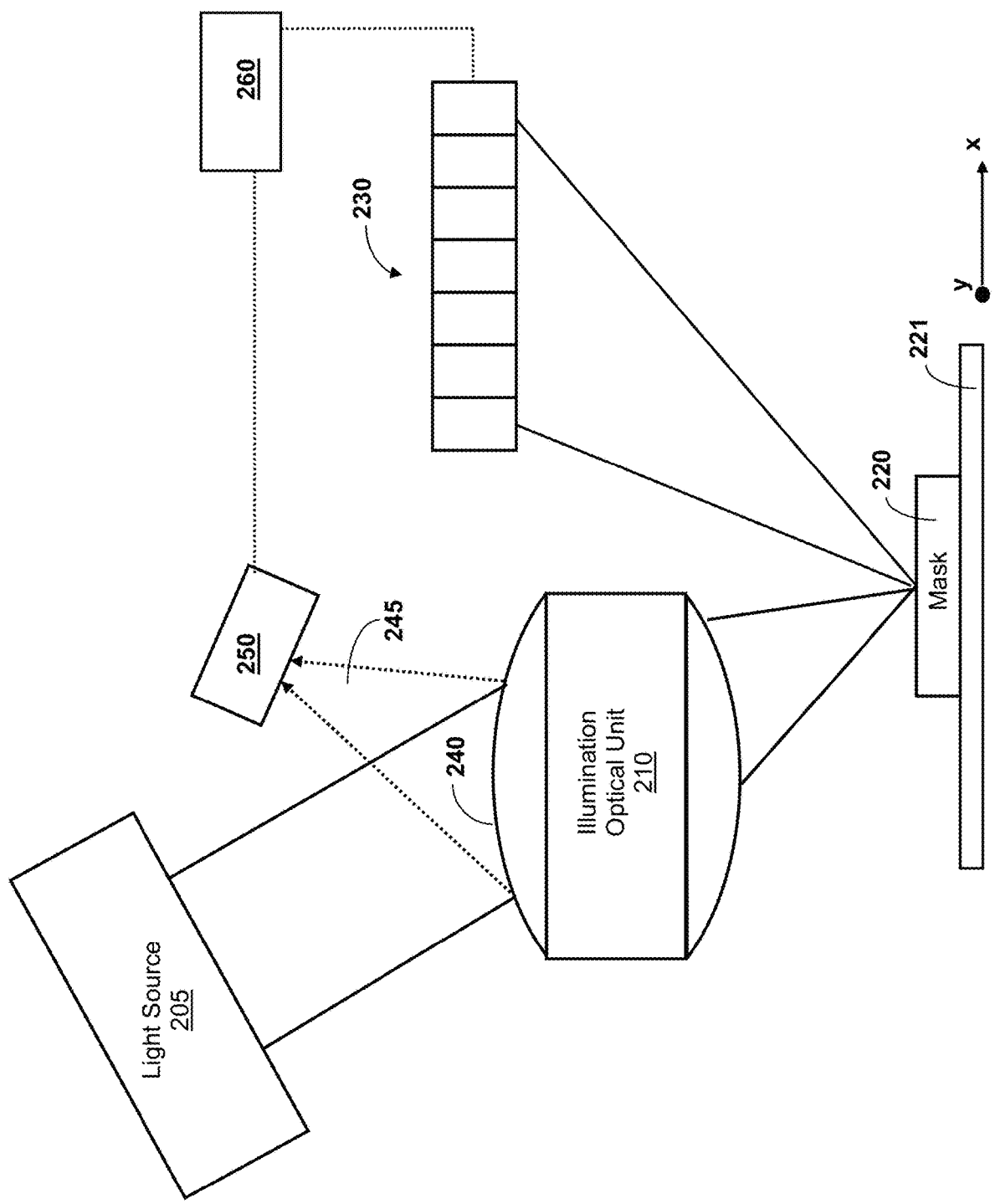
FIG. 2 shows a schematic illustration for explaining the possible set up of an apparatus according to the invention for characterizing a mask in a second embodiment.

FIG. 2 shows a schematic illustration of a further embodiment, wherein components that are analogous or substantially functionally identical in comparison with FIG. 1 are designated by reference numerals increased by "100". In contrast to the embodiment of FIG. 1, the output coupling element 240 as per FIG. 2 is a constituent part of the illumination optical unit 210, and so a back-reflection of the illumination optical unit 210 is used for the output coupling according to the invention. When the illumination optical unit 210 is configured as a zone plate, a region of the zone plate 311 can have a reflecting embodiment as per FIG. 3B and can consequently serve as an output coupling element 340.

In some implementations, the zone plate 310, 311 can be an EUV zone plate. The EUV zone plate can be fabricated using direct-write electron beam lithography. The EUV zone plate can have concentric rings of material that absorbs or blocks EUV radiation. The concentric rings of absorber material are formed on a membrane, which can be made of a material that allows at least some EUV radiation to pass through. For example, the absorber material can be made of nickel, gold, or tantalum nitride (TaN), and the membrane can be made of silicon nitride ($Si_3N_4$). For example, the output coupling element 340 can include a molybdenum (Mo)-silicon (Si) reflection layer stack.

In some implementations, an evaluation unit 260 receives outputs from the intensity sensor 250 and the sensor unit 230, and normalizes the images recorded by the sensor unit 230 using the output from the intensity sensor 250, and analyzes the normalized images to characterize the mask using the principles described above for the example of FIG. 1.

Figure 4:
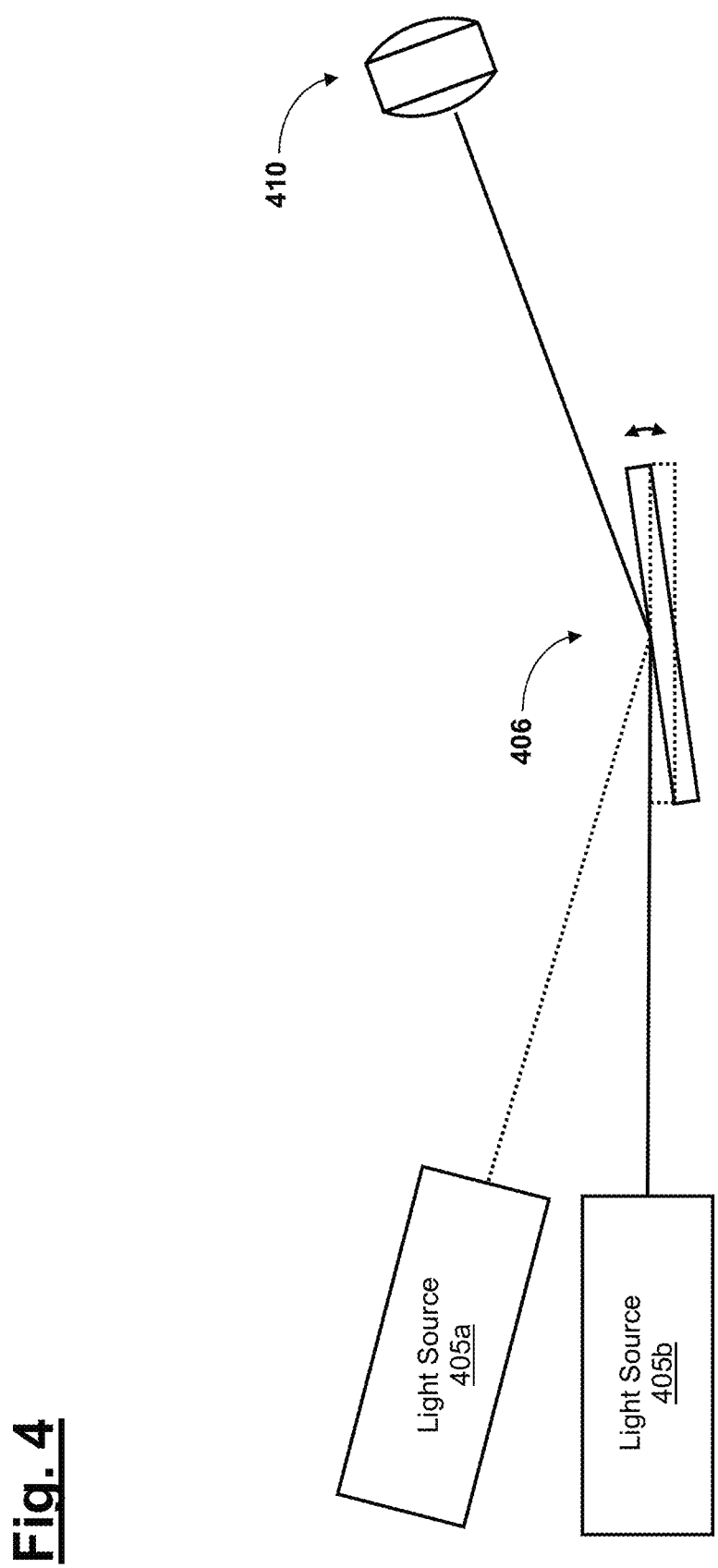
FIG. 4 shows a schematic illustration for explaining a configuration of an apparatus according to the invention with the use of a plurality of light sources.

In respect of the production of fully coherent light that reaches the illumination optical unit, the invention is not restricted to the use of a single light source. FIG. 4 shows a configuration with two light sources (e.g., HHG lasers) 405a, 405b in a purely schematic and much simplified illustration. The reference number "406" is used to denote an adjustable mirror as "switching optical unit" in order to steer light of one of the light sources (e.g., 405b) to the illumination device 410 during the respective dead times (between successive pulses) of the respective other light source (e.g., 405a), and vice versa. In particular, the mirror 406 can be configured and arranged in such a way that it is operated under grazing incidence (GI="grazing incidence") (wherein the angles of incidence occurring at the optically effective surface of the mirror 406 are at least 70° in relation to the respective surface normal), as a result of which intensity losses can be restricted. Here, the switching rate of the relevant mirror 406 can be chosen in suitable fashion depending on the pulse rate of the light sources 405a, 405b and can be located in the kHz range, for example. A controller (not shown in the figure) can be configured to control the adjustable mirror 406 as switching optical unit based on the timing of the dead times between successive pulses of the light sources 405a and 405b.

By using more than one light source, it is possible to take account of the typically quite significantly limited output power of coherent light sources or HHG lasers. In further embodiments, provision can also be made of more than two light sources for producing fully coherent light for impinging the illumination optical unit, in combination with an appropriate switching optical unit.

In further embodiments, the apparatus according to the invention comprises at least one mirror arranged under grazing incidence (i.e., with an angle of incidence on the optically effective surface of at least 70° in relation to the respective surface normal) in the illumination optical unit. Such a configuration allows a mask to also be examined at different operating wavelengths to 13.5 nm using the apparatus according to the invention—as a consequence of the substantial independence of the reflectivity from the wavelength in the case of grazing incidence—such that, in particular, it is also possible to use light sources for providing coherent light in a greater frequency spectrum for the purposes of obtaining a greater throughput. By way of example, such an additional mode of operation can be used to identify relatively large defects, which are bothersome in any case and consequently should be eliminated, already in advance, thereby already rendering an "actinic" examination (i.e., at the actual operating wavelength of the microlithographic projection exposure apparatus) thereof superfluous.

By way of example, a plurality of harmonic orders of an HHG source can be used for broadband illumination in said additional mode of operation, wherein it is possible to carry out a characterization at the actinic wavelength (e.g., using only one harmonic order of the HHG source) only following such preliminary inspection and only to the extent that this is still necessary.

Figure 5A:
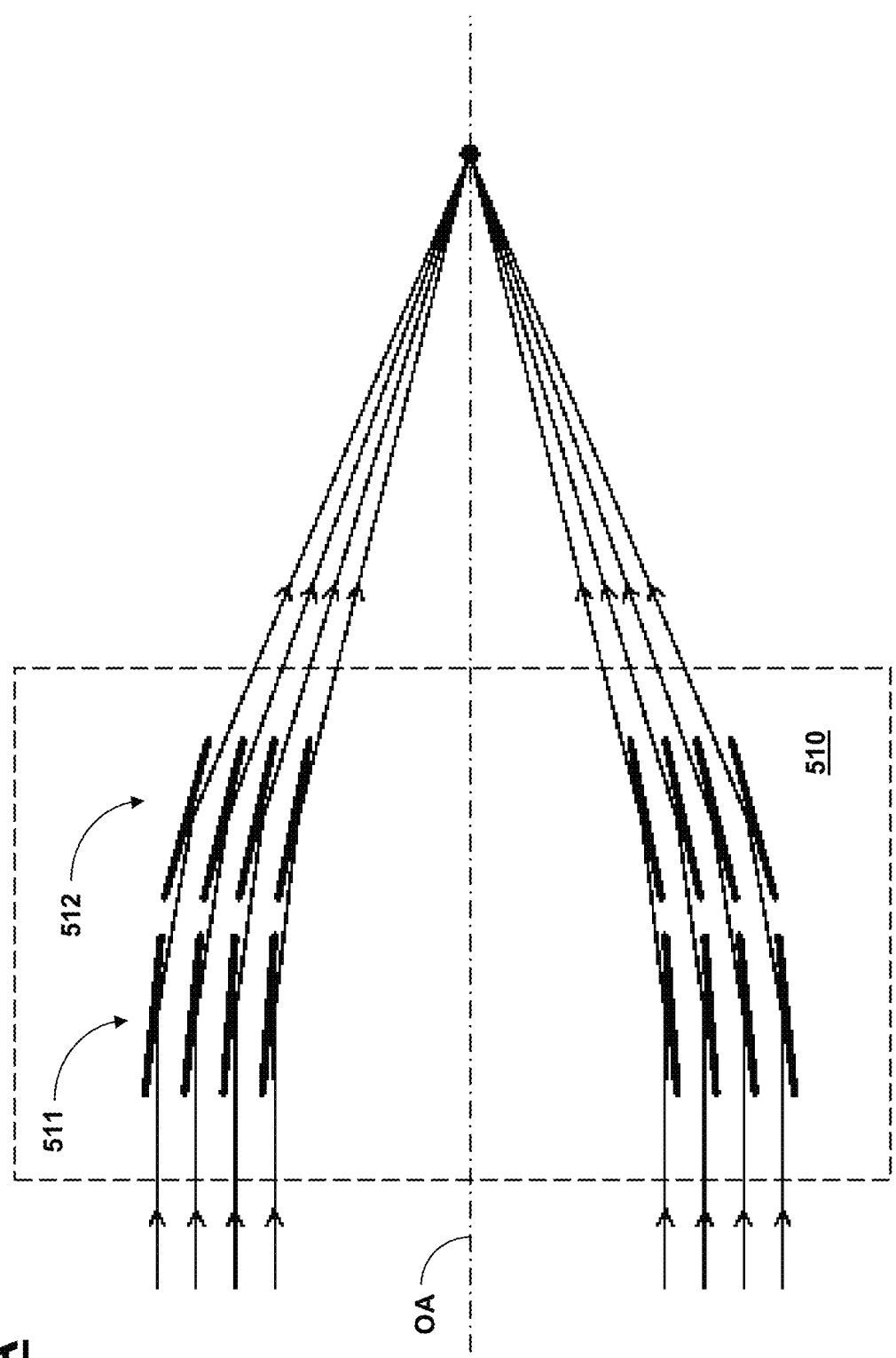

FIG. 5A shows, in a purely schematic illustration, a possible configuration of such an illumination optical unit 510, in which, starting with the principle of Wolter optics, use is made of an arrangement of a plurality of parabolic mirrors 511 that are interleaved concentrically to the optical axis OA in combination with a plurality of hyperbolic mirrors 512 that are likewise interleaved concentrically to the optical axis. In this way, as indicated in FIG. 5A, a collimated beam produced by the light source (not illustrated in FIG. 5A) can be focused on the diffraction-limited light spot on the mask (likewise not shown in FIG. 5A) by the illumination optical unit 510 under grazing incidence—and hence substantial wavelength independence in respect of the reflectivity.

The above-described realization of an illumination optical unit under grazing incidence is not restricted to the specific embodiment described on the basis of FIG. 5A but can be implemented in any suitable manner. Purely in exemplary fashion, FIG. 5B shows a further configuration of an illumination optical unit on the basis of two elliptically curved cylindrical mirrors 513, 514 which are arranged in succession in the beam path in a manner perpendicular to one another. The two cylindrical mirrors 513, 514 have corresponding foci, and so a focal line of the first cylindrical mirror 513 coincides with a focal line of the second cylindrical mirror 514 perpendicular thereto. In this example, the focal lines of cylindrical mirrors 513 and 514 lie in the same spatial plane and intersect each other, thereby defining a focal point.

Figure 6:
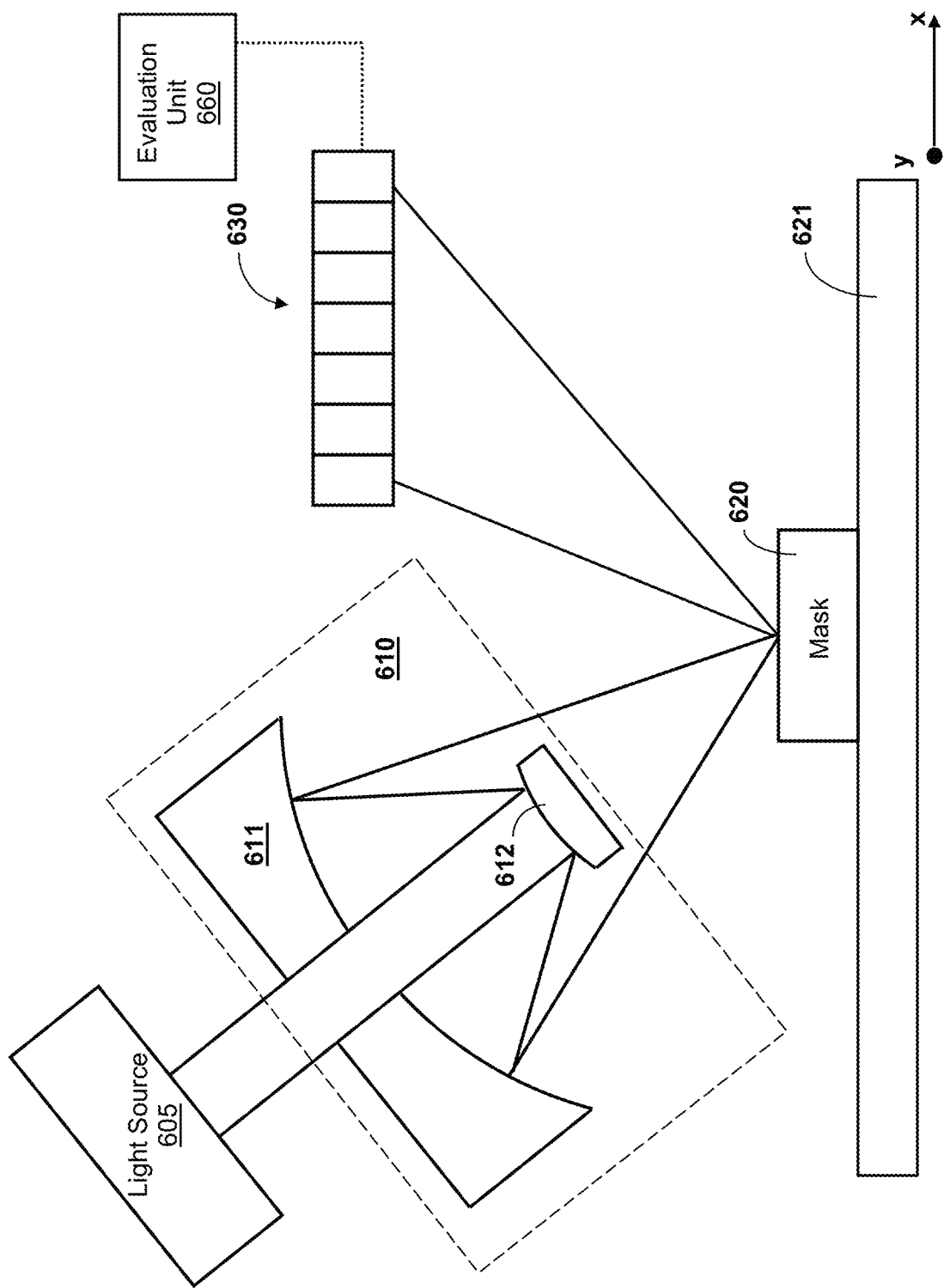
FIG. 6 shows a schematic illustration for explaining a further configuration of an illumination optical unit present in an apparatus according to the invention.

FIG. 6 shows a schematic illustration of a further configuration of an apparatus for characterizing a mask, wherein components that are analogous or substantially functionally identical in comparison with FIG. 1 are designated by reference numerals increased by "500". According to this aspect, the illumination optical unit comprises at least one mirror operated under substantially perpendicular incidence (i.e., with an angle of incidence on the optically effective surface of no more than 20° in relation to the respective surface normal). In the specific exemplary embodiment of FIG. 6, the illumination optical unit 610 is configured as a Schwarzschild optical unit with a concave mirror 611 and a convex mirror 612.

Figure 3A:
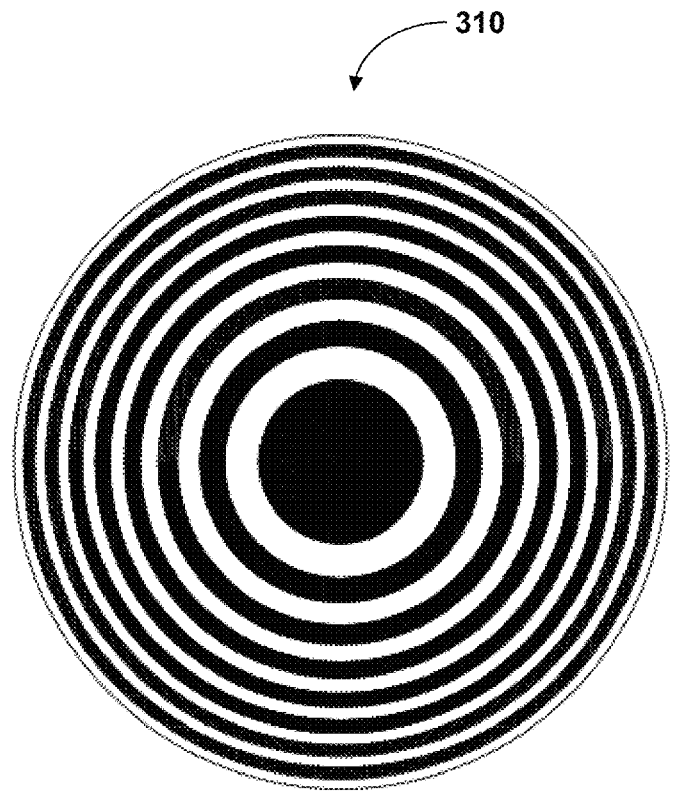
FIGS. 3A-3B show schematic illustrations for explaining possible configurations of an illumination optical unit present in an apparatus according to the invention.
Figure 3B:
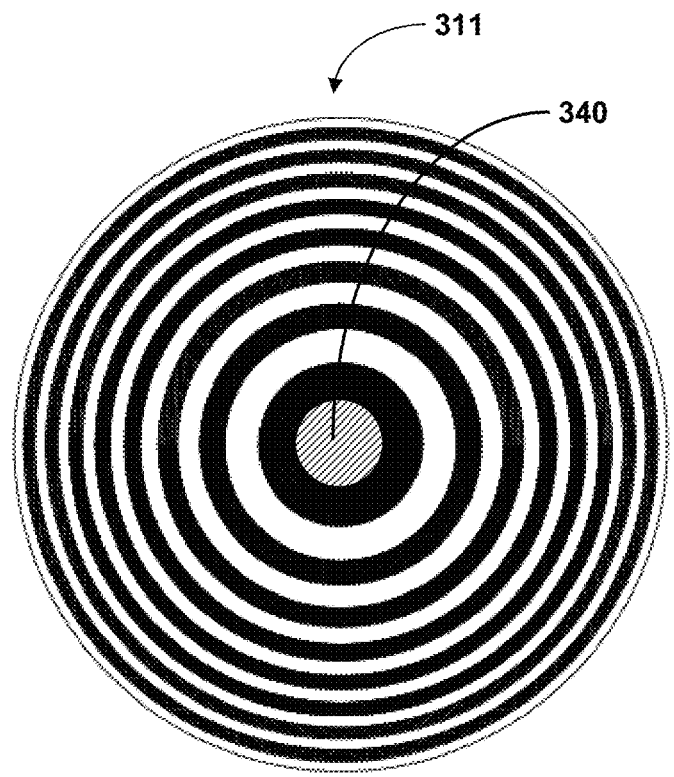

For instance, in comparison with the use of a zone plate implemented as per FIGS. 3A-3B, the configuration of the illumination optical unit 610 as per FIG. 6 is advantageous in that the illumination optical unit can be placed at a substantially greater distance from the mask 620 to be characterized since the limitations (in view of chromatic aberrations to be avoided) in this case that exist during the use of a zone plate are dispensed with. As a consequence, it is also possible as per FIG. 6 to characterize a mask which is examined, for instance, as a consequence of the presence of a protective membrane (for protecting the mask 620 from dust or other particles), which is typically arranged in turn at a distance of a plurality of millimeters (mm) from the actual mask structures.

The embodiment described above on the basis of FIG. 6 can be realized in combination with the concept of using an output coupling element and an intensity sensor, as described on the basis of FIG. 1; however, the concept described above on the basis of FIG. 6 can also be realized independently of the concept of using an output coupling element and an intensity sensor as described on the basis of FIG. 1.

Figure 7:
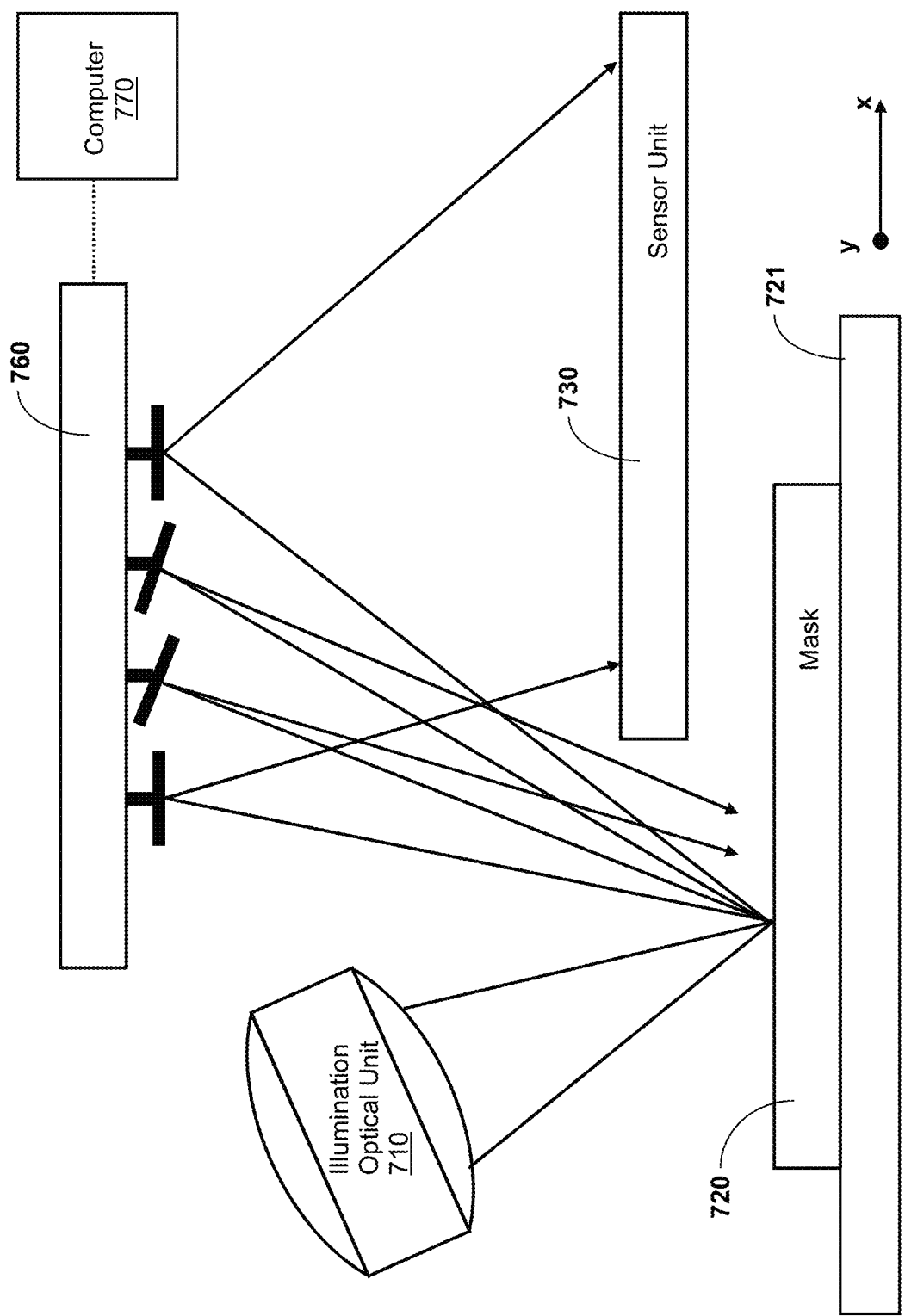
FIGS. 7-8 show schematic illustrations for explaining configurations of an apparatus for characterizing a mask according to further aspects of the disclosure.
Figure 8:
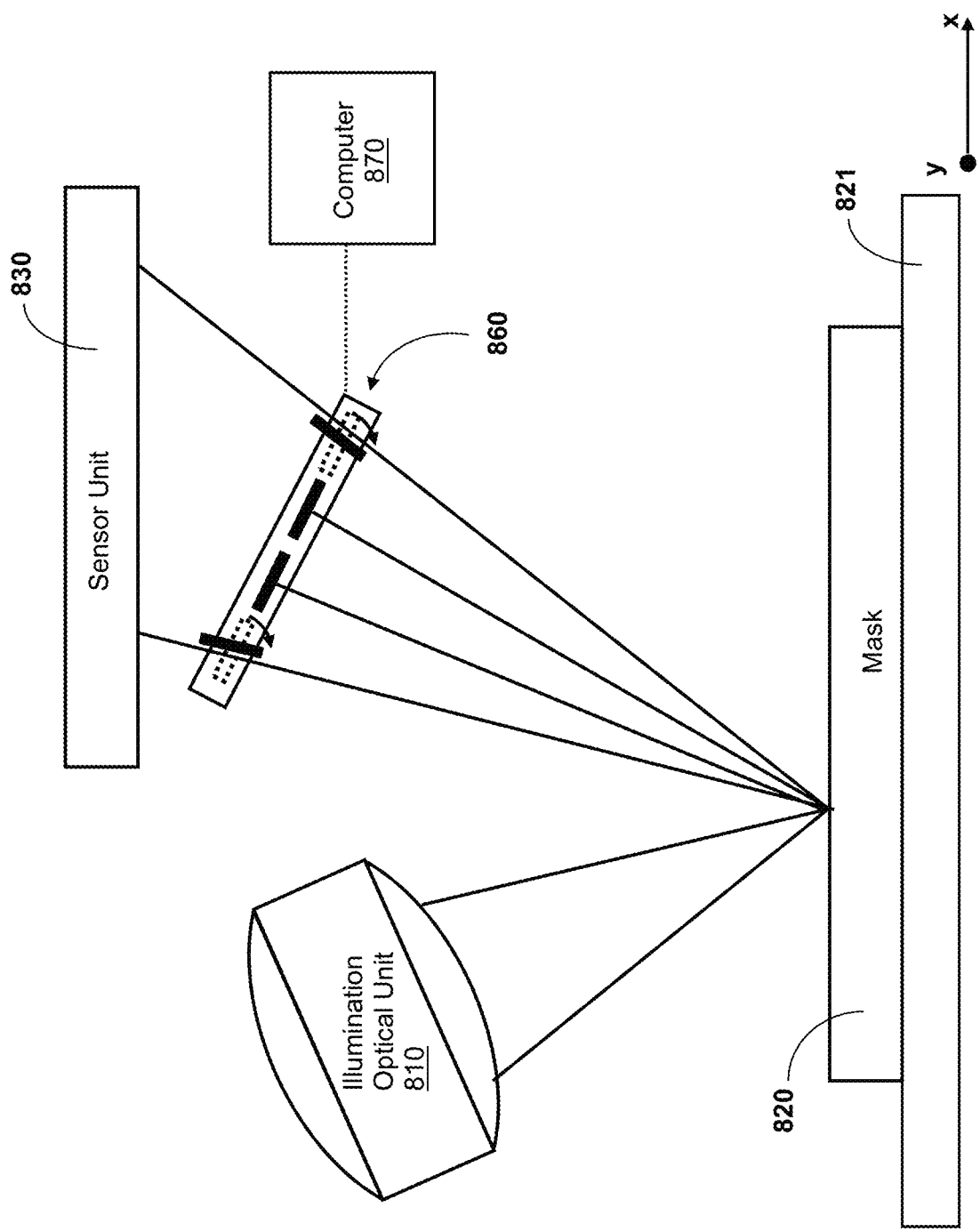

Even though a spatially resolved sensor unit is used respectively for recording images or for emulating the illumination optical unit of the projection exposure apparatus in the above-described embodiments and proceeding from the principle as per DE 10 2010 063 337 B4, the invention is not restricted thereto. FIG. 7 and FIG. 8 each show embodiments with an array made of a plurality of optical elements that are adjustable independently of one another, said array being arranged in the optical path between mask 720 or 820 and sensor unit 730 or 830. Here, said array is denoted by "760" and "860" in FIG. 7 and FIG. 8, respectively, with the illumination optical unit being denoted by "710" or "810".

Said array 760 or 860 allows the use of a simple, non-spatially resolved sensor for recording images, which only records the total intensity of the light incident thereon, instead of a spatially resolved ("pixelated") sensor unit. This is achieved by virtue of the fact that, for the purposes of emulating the illumination device of the microlithographic projection exposure apparatus, the array 760 or 860 already allows the implementation of a targeted elimination of individual pixels from the recorded region. Consequently, as per FIG. 7 or FIG. 8, the sensor unit 730 or 830 can be configured as a simple photodiode, for example.

As per FIG. 7, the array 760 comprises a plurality of mirror elements ("micro-mirrors") that are adjustable independently of one another and are able to selectively deflect the light respectively incident thereon such that said light is optionally incident or not incident on the sensor unit 730. As per FIG. 8, the array 860 is operated in transmission to the extent that, depending on the tilt position of the individual adjustable elements of the array 860, light is either blocked (like shutters) or transmitted to the sensor unit 830 or photodiode.

Blocking some of the light serves for emulating the illumination setting. Certain parts of the light are thrown away using the MMA depending on the illumination setting to be emulated, in order to realize the concept according to which the illumination setting of the microlithographic projection exposure apparatus is emulated on the imaging side of the scanning microscope, while the illumination optical unit of this scanning microscope is designed in such a way that it emulates the projection optical unit of the microlithographic projection exposure apparatus, see also DE 10 2010 063 337 B4.

In some implementations, the array 760 or 860 is controlled by a computer (770 or 870), which determines which mirror elements are tilted so as to direct light from the mask 720 or 820 to the sensor unit 730 or 830, and which mirror elements are tilted so as to direct light from the mask 720 or 820 away from the sensor unit 730 or 830. For example, the computer can determine the titling of the mirror elements based on input data that has information about the illumination settings of the microlithographic projection exposure apparatus.

The configurations described above on the basis of FIG. 7 and FIG. 8 can also be realized in combination with the concept of using a light output coupling element and intensity sensor, as described on the basis of FIG. 1, or else be realized independently thereof.

In further embodiments of the invention (and once again in combination with or else independently of the configurations described above), a phase aberration can be impressed in the optical beam path by the use of a phase shifter element in order to emulate corresponding aberration properties of the microlithographic projection exposure apparatus.

Exemplary embodiments of and suitable materials for such phase shifter elements are described in U.S. Pat. No. 10,001,631 B2 and 10,151,922 B2. The entire contents of the above patents are incorporated by reference. In particular to take account of the coupling of wavefront and transmission change, such a phase shifter element can be constructed from two individual films, the shape and materials of which are chosen in such a way that the transmission loss at a given phase change can be kept constant.

Figure 9:
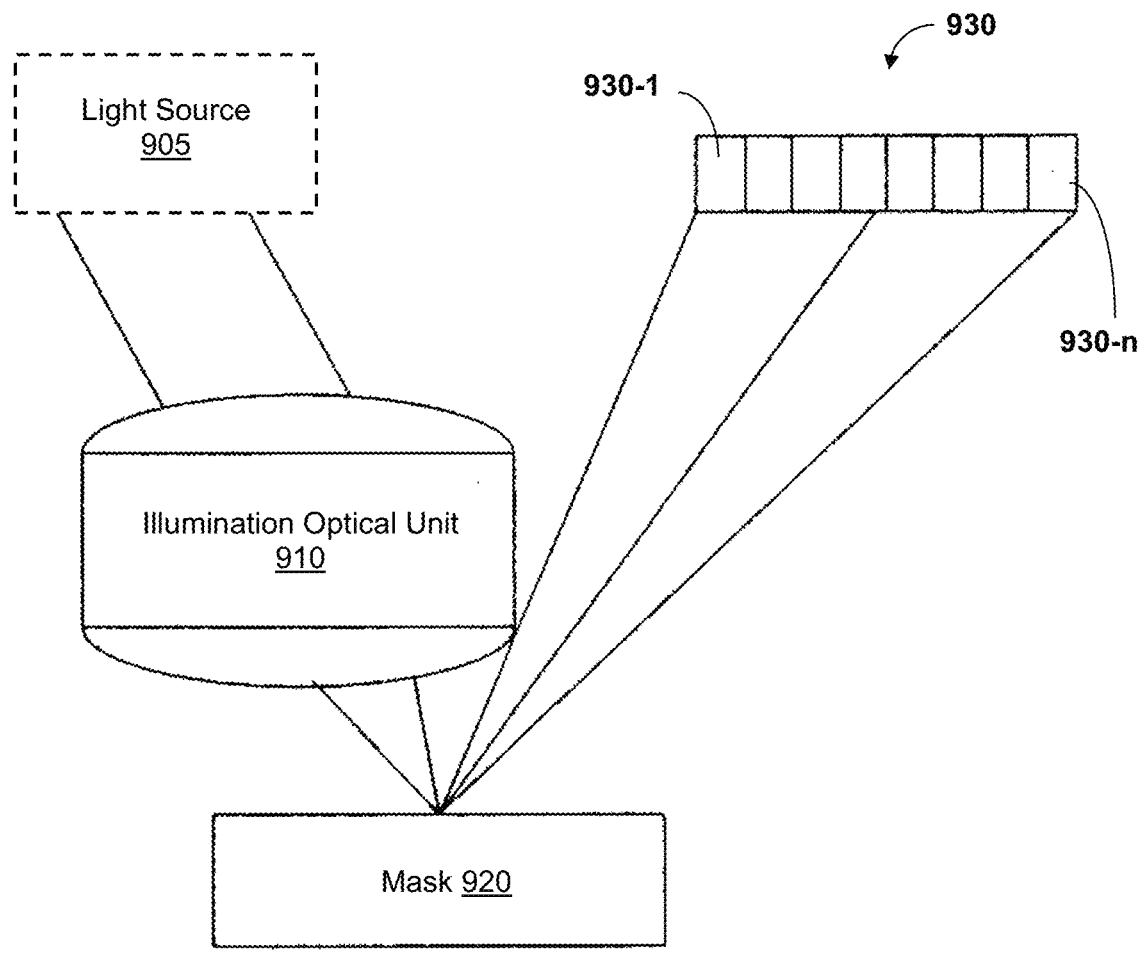
FIG. 9 shows a schematic illustration for explaining a conventional set up of an apparatus for characterizing a mask.

Starting from the principle of DE 10 2010 063 337 B4 illustrated in FIG. 9, an apparatus for characterizing a mask can also be configured or operated in such a way according to a further aspect of the disclosure that a microlithographic projection exposure apparatus comprising an anamorphic imaging system is emulated. Here, anamorphic imaging is understood to mean imaging which produces a distorted image of the object and which is not an instance of similarity imaging (i.e. which is not representable by a combination of displacement, rotation, mirroring and scaling). In a special case, such an anamorphic imaging system may be e.g. a projection lens which has different imaging scales along two mutually different axes.

Now, in principle, the characterization of a mask in respect of defects present is also desirable for different defocus levels of the wafer in the microlithographic projection exposure apparatus to be emulated, wherein the relevant defocusing of the wafer in the apparatus according to the invention corresponds in turn to a defocusing of the reticle. Now, such a defocusing can be taken into account by the targeted addition of an aberration in the form of an astigmatism in the optical path between light source and mask to be characterized. By way of example, a phase shifter element can be inserted into the illumination beam path to this end, or the illumination optical unit (e.g., the zone plate as per FIG. 3, the Schwarzschild optical unit as per FIG. 6, etc.) can be continuously deformed accordingly. A suitable phase shifter element for use in the EUV range that is continuously variable in respect of the phase shift and is based on the so-called Alvarez principle is described in DE 10 2018 201 495 A1, the entire content of which is incorporated by reference.

In some implementations, the dimension of the diffraction-limited light spot is as small as possible and substantially defined or limited by diffraction, and not by other effects such as aberrations.

There are a number of approaches to the emulation of the illumination settings. For example, as described in DE 10 2010 063 337 B4, the illumination setting can be emulated by considering only those pixel in a spatially resolved sensor arrangement that are "valid" for the illumination setting. In some implementations, another approach can be used, which is to use a micro mirror array (MMA) as a hardware component that already eliminates/throws away certain parts of the light depending on the illumination setting to be emulated, in which case a simple photodiode (non-spatially resolved) instead of a CCD camera can be used a detector.

In some implementations, the evaluation unit used to analyze the imaging effects of the mask 120, 220, 620, 720, 820 and compensate for energy fluctuations of the light source 105, 205, 605 according to the principles described above, or the computer used to control the array 760 or 860, can include one or more data processors for processing data, one or more storage devices for storing data, such as one or more databases, and/or one or more computer programs including instructions that when executed by the computer causes the computer to carry out the processes. The evaluation unit or the computer can include one or more input devices, such as a keyboard, a mouse, a touchpad, and/or a voice command input module, and one or more output devices, such as a display, and/or an audio speaker. The evaluation unit or the computer can show graphical user interfaces on the display to assist the user of the apparatus shown in FIGS. 1, 2, and 6 to 8.

In some implementations, the evaluation unit or the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the evaluation unit or the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for analyzing the imaging effect of the mask described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Even though the invention has been described on the basis of specific embodiments, numerous variations and alternative embodiments will be apparent to a person skilled in the art, for example through combination and/or exchange of features of individual embodiments. Accordingly, it goes without saying for a person skilled in the art that such variations and alternative embodiments are encompassed by the present invention, and the scope of the invention is only restricted as provided by the appended patent claims and the equivalents thereof.

What is claimed is:

1. An apparatus for characterizing a microlithographic mask, comprising
    at least one light source which emits coherent light;
    an illumination optical unit which produces a diffraction-limited light spot on the mask from the coherent light of the at least one light source, wherein the illumination optical unit comprises a zone plate;
    a scanning device, by use of which it is possible to implement a scanning movement of the diffraction-limited light spot relative to the mask;
    a sensor unit; and
    an evaluation unit for evaluating the light that is incident on the sensor unit and has come from the mask;
    wherein the apparatus comprises:
    an output coupling element for coupling out a portion of the coherent light emitted by the at least one light source wherein the output coupling element is formed by a reflecting region of said zone plate; and
    an intensity sensor for capturing the intensity of this output coupled portion.

2. The apparatus of claim 1, wherein the output coupling element is a reflective element.

3. The apparatus of claim 1, wherein the output coupling element is designed to output couple a portion of the coherent light emitted by the at least one light source, the intensity proportion of which is less than 10%, in particular less than 5%, further particularly less than 1%.

4. The apparatus of claim 1, wherein the output coupling element is arranged in the illumination optical unit.

5. The apparatus of claim 1, further comprising at least one array of a plurality of optical elements that are adjustable independently of one another, said array being arranged in the optical path between the mask and the sensor unit.

6. The apparatus of claim 5, wherein the plurality of optical elements comprises a plurality of mirror elements that are adjustable independently of one another to selectively deflect the light respectively incident thereon such that said light is incident or not incident on the sensor unit.

7. The apparatus of claim 1, wherein the at least one light source is an HHG laser.

8. The apparatus of claim 1, further comprising a plurality of coherent light sources.

9. The apparatus of claim 1, wherein the illumination optical unit comprises at least one mirror, the latter being arranged in such a way that the angles of incidence arising at an optical effective surface of said mirror during the operation of the apparatus are at least 70° in relation to the respective surface normal.

10. The apparatus of claim 1, wherein the illumination optical unit comprises at least one mirror, the latter being arranged in such a way that the angles of incidence arising at an optical effective surface of the mirror during the operation of the apparatus are at most 20° in relation to the respective surface normal.

11. The apparatus of claim 1, further comprising at least one phase shifter element in the optical path between light source and mask.

12. The apparatus of claim 1, wherein the evaluation unit is configured to evaluate the light that is incident on the sensor unit and compensate fluctuations in energy levels of the coherent light from the at least one light source based on the intensity of the output coupled portion captured by the intensity sensor.

13. A method for characterizing a microlithographic mask,
wherein a diffraction-limited light spot is produced on the mask from coherent light produced by at least one light source by way of an illumination optical unit that comprises a zone plate having a reflecting region;
wherein a scanning movement of the diffraction-limited light spot is implemented relative to the mask; and
wherein light that is incident on a sensor unit and has come from the mask is evaluated;
wherein a portion of the coherent light emitted by the at least one light source is output coupled by said reflecting region of said zone plate and the intensity of this output coupled portion is captured.

14. A method for characterizing a microlithographic mask, the method comprising:
producing, using at least one light source, coherent light;
producing, using of an illumination optical unit, a diffraction-limited light spot on the mask from the coherent light, wherein the illumination optical unit comprises a zone plate having a reflecting region;
implementing a scanning movement of the diffraction-limited light spot relative to the mask;
evaluating light that has come from the mask and is incident on a sensor unit;
output coupling a portion of the coherent light emitted by the at least one light source by said reflecting region of said zone plate; and
capturing an intensity of the output coupled portion.

15. The method of claim 14, wherein the intensity of the output coupled portion of the coherent light is less than 10% of the intensity of the coherent light emitted by the at least one light source.

16. The method of claim 14, comprising arranging the output coupling element between the at least one light source and the illumination optical unit.

17. The method of claim 14, comprising evaluating the light that has come from the mask and is incident on the sensor unit and compensate fluctuations in energy levels of the coherent light produced by the at least one light source based on the captured intensity of the output coupled portion.

* * * * *

UNITED STATES PATENT AND TRADEMARK OFFICE
CERTIFICATE OF CORRECTION

| | |
|---|---|
| PATENT NO. | : 11,914,303 B2 |
| APPLICATION NO. | : 17/345024 |
| DATED | : February 27, 2024 |
| INVENTOR(S) | : Johannes Ruoff et al. |

It is certified that error appears in the above-identified patent and that said Letters Patent is hereby corrected as shown below:

On the Title Page

Page 2
Column 2 (Other Publications), Line 29, delete "10-2021-007469" and insert -- 10-2021-0074695 --

Signed and Sealed this
Sixteenth Day of April, 2024

Katherine Kelly Vidal
*Director of the United States Patent and Trademark Office*